United States Patent [19]

[11] 3,781,869

Sudnick et al.

[45] Dec. 25, 1973

[54] TRANSDUCER AMPLIFIER WITH AUTOMATIC BALANCE

[75] Inventors: Dennis J. Sudnick; Robert L. Shutts, both of Elyria, Ohio

[73] Assignee: Inservco, Inc., La Grange, Ohio

[22] Filed: Mar. 20, 1972

[21] Appl. No.: 236,056

[52] U.S. Cl. ......... 340/347 CC, 73/1 R, 235/151.3, 340/347 AD

[51] Int. Cl. ...................... H03k 13/02, G01n 21/20

[58] Field of Search ............... 340/347 AD, 347 CC; 330/9; 324/99 T, 130, 131; 73/1 R, 1 B, 362 SC; 177/165; 328/146; 235/151.3

[56] References Cited

UNITED STATES PATENTS

| | | | |
|---|---|---|---|
| 3,634,868 | 1/1972 | Pelavin | 73/1 R |
| 3,714,806 | 2/1973 | Berkey | 324/130 |
| 3,421,375 | 1/1969 | Dimon | 73/362 SC |
| 3,348,143 | 10/1967 | Young | 324/131 |
| 3,599,105 | 8/1971 | Weir | 328/146 |
| 3,070,786 | 12/1962 | MacIntyre | 340/347 DA |
| 3,491,295 | 1/1970 | Saun | 340/347 CC |
| 3,419,819 | 12/1968 | Murakami | 340/347 CC |
| 3,560,957 | 2/1971 | Miura | 340/347 CC |
| 3,503,064 | 3/1970 | Takakabe | 340/347 CC |
| 3,475,748 | 10/1969 | Price | 340/347 CC |
| 3,366,948 | 1/1968 | Price | 340/347 CC |
| 3,105,230 | 9/1963 | MacIntyre | 340/347 CC |

*Primary Examiner*—Thomas A. Robinson
*Attorney*—Walter Maky

[57] ABSTRACT

An amplifier for strain gages and other transducers in quarter, half or full bridge configurations provides an analog output suited for measurement, control or display purposes. The amplifier includes temperature compensation and automatic zero balance, the former realized from the voltage-temperature characteristic of a silicon PN junction used to affect the offset of an integrated circuit amplifier stage. The signal for zero balance is derived from the amplifier output, sampled and retained in an analog to digital converter and reconverted to analog form for application to a stage of the amplifier in opposition to the measurement signal, resetting for zero balance being under manual control.

17 Claims, 4 Drawing Figures

TRANSDUCER AMPLIFIER WITH AUTOMATIC BALANCE

BACKGROUND OF THE INVENTION

This invention relates to transducer amplifiers and more particularly to an amplifier for providing an analog output of a transducer signal, having novel temperature compensation and an automatic zero balancing feature.

The unstable characteristics of high gain amplifier circuits of this type are well known in this art, the most pronounced effect being caused by component variation due to temperature change inasmuch as most critical circuits employ some type of voltage or current regulation. Inherent component variations due to aging and the like also have an effect and can become significant when extremely high gain levels are involved. While many different forms of temperature stabilization circuits have been devised to partly overcome these problems, such compensation only approaches an ideal and, often excessively complex circuits are relied upon. Further, means must be included in critical circuits for achieving a balance condition or for setting the variable components thereof to a predetermined initial condition when it is desired to monitor deviations from a norm or when operation in a predetermined range is required for linearity and/or accuracy.

It is desirable to remove as much as possible of such preconditioning function from operator control so as to facilitate measurements and to avoid inadvertent errors and the like and it would be desirable to provide apparatus having inherent temperature compensation adequate for most measurement purposes and in addition automatic means selectable by the operator for zeroing the instrument to predetermined initial conditions for critical measurements.

SUMMARY OF THE INVENTION

Therefore, it is one object of this invention to provide improved amplifier apparatus having temperature compensation therein realized from the voltage characteristic of a solid-state PN junction.

It is another object of this invention to provide improved amplifier apparatus in which temperature compensation is derived from the voltage characteristic of a silicon diode.

It is still another object of this invention to provide improved amplifier apparatus for transducer devices and the like which apparatus includes an automatic zero balance circuit therein.

It is a still further object of this invention to provide improved amplifier apparatus utilizing a digital memory as a part of zero balancing circuitry.

It is yet another object of this invention to provide improved amplifier apparatus for transducers and the like which is suitable for measurement in quarter, half or full bridge configurations, and which includes automatic zero balancing and temperature compensation by semiconductor junction voltage variation.

It is a still further object of this invention to provide an improved transducer amplifier with temperature compensation having automatic zero balance available at the selection of the operator.

It is a yet further object of this invention to provide a digital sample and hold circuit having capacity for infinite memory time and immunity to noise.

These and other objects are realized in the instant invention in amplifier circuitry which includes a first integrated circuit amplifier adapted to receive single ended or bipolar signals from transducer components and the like, which amplifier is modified in offset characteristics for temperature stabilization by the voltage signal developed from a silicon diode. The thus compensated signal is utilized as one input to a differential amplifier connected as a unity gain amplifier, the second input of which is temporarily grounded to develop a conditional output signal. Such conditional signal is modified by a multiplier having predetermined gain, converted to digital form and retained for use as a balance signal, being converted again to the analog form, reduced in amplitude in a divider circuit by the reciprocal of the gain of the multiplier and applied as the balance signal to the second input of the unity gain amplifier through suitable switching circuitry. Balance signal development is controlled from externally available switching circuitry, appropriate delays being utilized to allow circuit stabilization prior to monitoring.

Other objects and advantages of the present invention will become apparent as the following description proceeds.

To the accomplishment of the foregoing and related ends, the invention, then, comprises the features hereinafter fully described, the following description and the annexed drawings setting forth in detail a certain illustrative embodiment of the invention, this being indicative, however, of but one of the various ways in which the principles of the invention may be employed.

DESCRIPTION OF THE PREFERRED EMBODIMENT OF THE INVENTION

Figures 1, 2, 3:
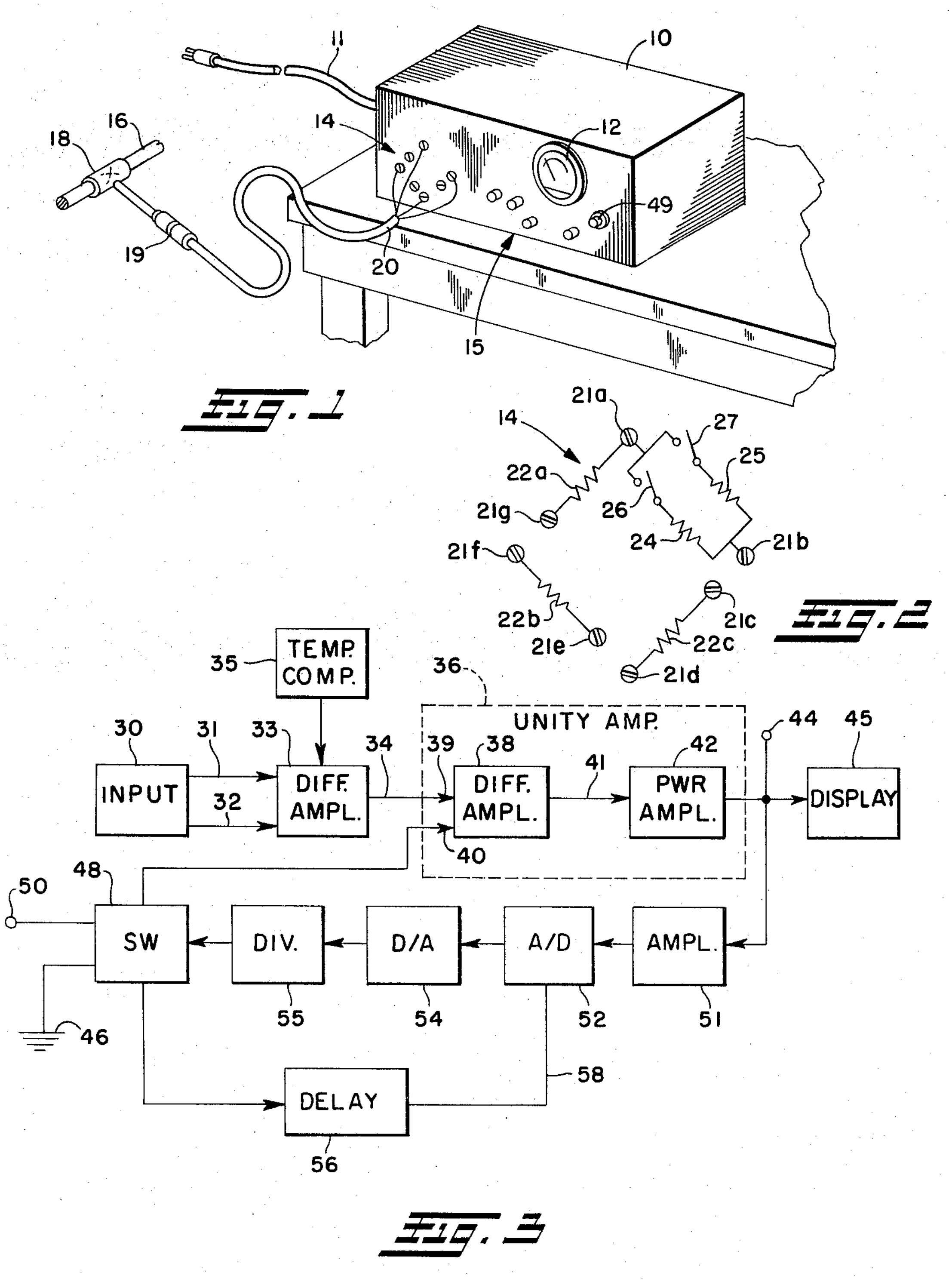
FIG. 1 is an environmental view of the apparatus of this invention shown in a typical measurement condition.
FIG. 2 is a schematic circuit diagram showing the input connection arrangement of the amplifier apparatus of this invention.
FIG. 3 is a block diagram of the logic scheme of this invention.

Referring now to the FIG. 1 environmental view of the apparatus of the invention, there is shown a cabinet 10 for housing the apparatus of this invention, adapted for receipt of conventional power by means of a cord 11 and including a meter 12 thereon for readout purposes. Input terminals 14 are also provided on the front of the cabinet 10 together with suitable controls 15 for balancing and gain setting purposes to be described in greater detail hereinafter.

A typical application for the apparatus of the invention is depicted in FIG. 1 by the showing of a shaft 16 which forms a part of equipment in which torque, for example, is to be transmitted, such shaft 16 having a group of strain gages 18 thereon in rosette configuration for monitoring the degree of twist of the shaft 16, signals being transmitted through a conventional connector 19 and lead wire arrangement 20 to the input terminals 14 on the cabinet.

The versatility of this apparatus is indicated to some extent by the enlarged view of the input terminals 14 in FIG. 2 showing a group of seven screw terminals 21*a–g* arranged in diamond configuration with various impedances 22*a–c* depicted as connected therebetween, forming the typical bridge arrangement for measurement and calibration purposes. A pair of calibration resistors 24, 25 are included in one leg of the bridge having respective switches 26, 27 in series connection therewith, being in a normally open condition but adapted for selected closure by the operator. Typically the signal to be applied to the amplifier portion of the apparatus is taken from terminals 21*a*, 21*d* while bridge excitation is applied at the opposite diagonal connection being terminals 21*b*, 21*f*. The impedances 22*a–c* indicated are internal of the cabinet 10 but are alterable by the operator while the terminals 21*a–g* are external to provide any configuration of input mode including the quarter, half or full bridge arrangements and suitable jumpers may be employed between any of the terminals for completion of the partial or full bridge circuits.

For example, in a quarter bridge configuration the single strain gage connection would be across terminals 21, 21*b* in common with the calibration resistors 24, 25 and switches 26, 27. Half bridge configuration is achieved by placement of active elements across terminals 21*a*, *b* and 21*a*, *f*, with jumpers being utilized at terminals 21*b*, *c* and 21*d*, *e*, and the signal taken from the uppermost terminal 21*a*, 21*d*. In the full bridge configuration the strain gages are connected between terminals 21*a*, *b*, 21*a*, *f*, 21*d*, *f* and 21*b*, *d*. Alternatively the amplifier may be arranged for differential amplification, wherein all jumpers are removed with the input leads connected to terminal 21*a* as the noninverting input and to terminal 21*d* as the inverting input, with a common auxiliary ground connection.

Referring now to the FIG. 3 block diagram of the system, an understanding of the general operation of same can be obtained quite readily. The various possible input alternatives to the system are designated by the block labeled input 30 which provides a signal to the inputs 31, 32 of a differential amplifier 33 connected for single ended or difference amplification to provide an output signal on line 34.

The differential amplifier 33 is a high input resistance amplifier, nominally on the order of 1,000 megohms, and has an adjustable gain. At the extremely high gain levels drift due to temperature variations can become considerable and a temperature compensation circuit 35 is provided for modifying the output of the differential amplifier 33 as a function of temperature. In this embodiment of the invention a temperature compensation signal is derived from the forward voltage drop of a PN junction, such voltage variation being a well known characteristic of such solid-state devices, providing suitable control with minimal components.

The output 34 of the differential amplifier 33 is applied as one input to a unity amplifier stage 36, this including a differential amplifier 38 of the integrated circuit variety having an inverting input 39 and a non-inverting input 40. The output 41 of the differential amplifier 38 is applied to a power amplifier stage 42 to provide an analog output signal at terminal 44 which is suited for measurement, control or monitoring purposes. The output at terminal 44 may be converted to a visual readout by the display unit 45 which is indicated in FIG. 1 as the meter 12 at the front of the cabinet 10 but alternatively could be a digital display device or any other form of desired display.

In such straightforward amplification scheme, the non-inverting input 40 of the unity amplifier 36 may be selectively connected to ground 46 as a reference level by means of a switching unit 48. However, it is often desirable and it is a feature of this invention that this input 40 to the amplifier 36 can be selectively referenced to a level other than ground and at any time under command of the operator. This type of measurement is especially significant where it is desired to cancel out initial unbalance or the like introduced by the various input connections in order to monitor only the variations from such initial condition both for ease of readout and for accuracy of measurement. Similarly such mode of measurement is advantageous in maintaining the components of the circuit in linear operational ranges. This form of measurement is conventionally known as a zero balance measurement, i.e., bringing the output signal to a zero level for a given set of input conditions.

Zero balancing is accommodated in this circuit by the temporary connection of the non-inverting input 40 of the unity amplifier 36 to ground 46, measuring and retaining the analog signal occurring at the output terminal 44 at this time and then applying such signal or a signal proportional thereto to the non-inverting input 40 of the unity amplifier 36 as a continuous signal. This signal is maintained for further measurements until the zero balancing circuitry is again recycled. Recycling is initiated by the operator by actuating switch 49 located at the front of the cabinet 10, closure of which corresponds to the application of a control signal at terminal 50 applied to the switching circuitry 48.

The analog signal realized at the output terminal 44 is applied to an amplifier stage 51 which acts as a multiplier to boost the signal level for application to the memory portion of the system indicated as an A/D (analog to digital) converter 52. This unit retains the signal in digital format thereby providing infinite memory time, and has sufficient capacity to accommodate the various levels of signal received from the amplifier 51 and to provide sufficient definition of same by the number of bits employed therein. The digital signal is continuously converted to an analog format in a D/A (digital to analog) converter 54 compatible with the A/D converter 52, applied in turn to a divider stage 55 comprising an adjustable impedance network for reducing the level of the analog signal for application to the switching circuitry 48 and thus to the non-inverting input 40 of the unity amplifier 36 when the circuit is returned to the operational mode. Recycling of the A/D converter 52 occurs each time the switching circuitry is activated, a pluse being supplied by way of the delay unit 56, thereby allowing sufficient time for the remainder of the system to stabilize prior to monitoring.

Assuming for the puposes of description that there is a positive one volt output siganl from the differential amplifier 33, resulting from an unbalance at the input 30, by inversion in the unity amplifier 36 such signal would appear as a negative 1 volt output at terminal 44. The gain of the multiplier amplifier stage 51 may be preset to a factor of 8 and with inversion produces a positive 8 volt signal at the input to the A/D converter 52. The switching unit 48 has been previously actuated so that the non-inverting input 40 of the unity amplifier 36 is connected to ground 48 and after a short delay, on the order of 50 milliseconds, a clock pulse is produced on line 58 causing registration of the 8 volt signal in digital format. The digital signal then is converted to analog form in the D/A converter 54 and divided by 8 in the preadjusted divider unit 55 to apply a positive one volt signal to the non-inverting input 40 of the unity amplifier 36 when the switching unit 48 reverts to the original condition.

The gain adjustment of the multiplier amplifier 51 and the division factor of the divider unit 55 should be substantially the same less any differences which occur in quantizing and the like, and need not be set at the figure of 8 mentioned. This ratio establishes the amount of unbalance that can be accommodated at the output of the differential amplifier 33. If the gain of the multiplier amplifier 51 is increased, the percentage of output of the differential amplifier 33 is decreased, however, the resolution in the A/D converter 52 is improved, while the converse is obtained in the gain of the multiplier amplifier 51 is decreased.

DETAILED DESCRIPTION OF OPERATION

Figure 4:
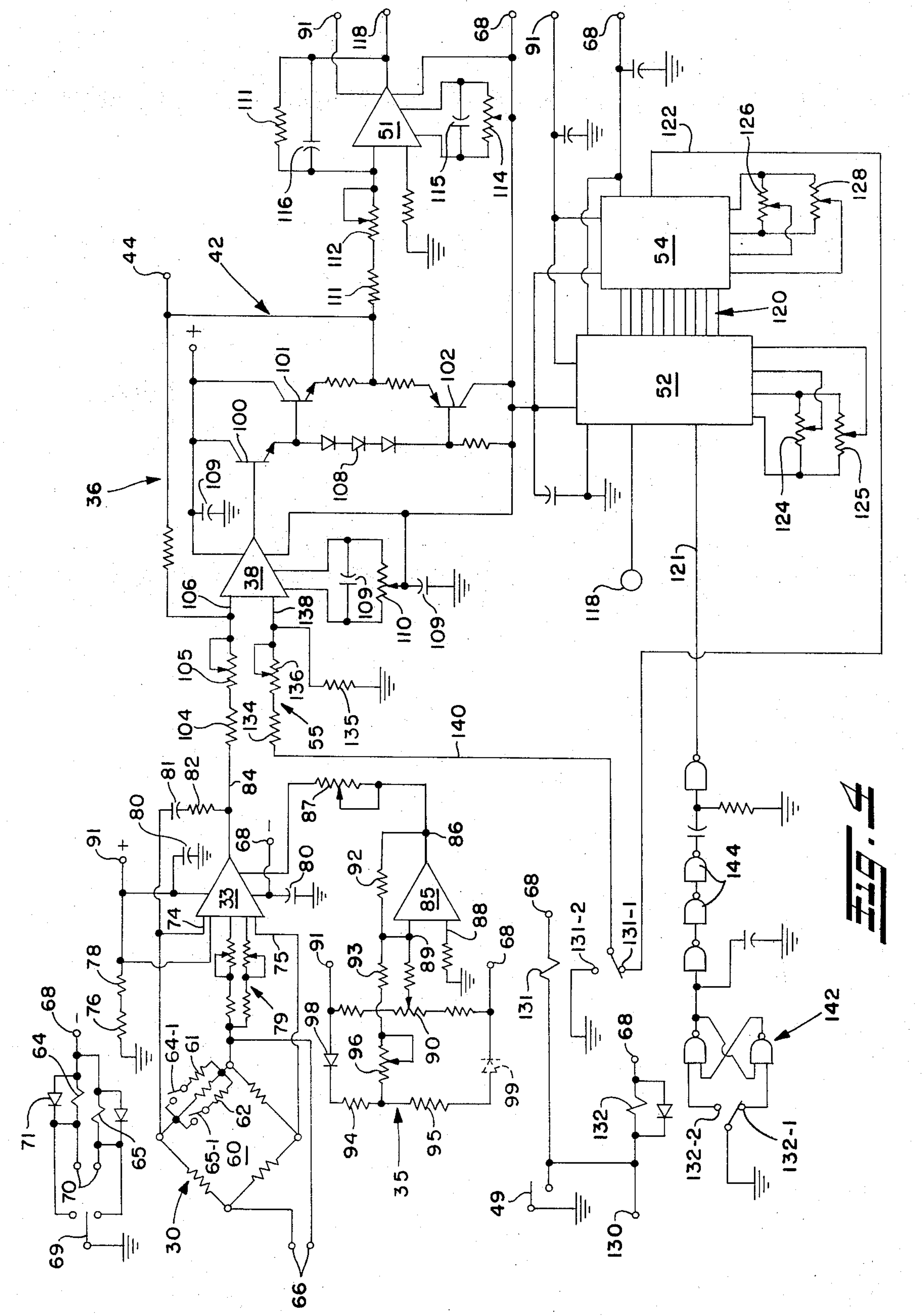
FIG. 4 is a schematic diagram partly in block diagram form of the preferred embodiment of this invention.

Referring now to the schematic diagram of FIG. 4, there is shown a preferred embodiment of the invention utilizing common reference numerals with the block diagram of the system depicted in FIG. 3 insofar as possible. The input circuitry 30 is indicated in full bridge arrangement 60 including a pair of calibration resistors 61, 62 and relay contacts 64–1, 65–1 in series connection in one leg of the bridge 60, a transducer or other device providing an input signal normally completing this leg of the bridge. Bridge 60 excitation voltage, typically being plus or minus 5–10 volts DC, is applied at terminals 66 from an external power source. The relay contacts 64–1, 65–1 are associated with relays 64, 65 connected in common to a negative source of potential 68 and adapted for energization by connection to ground through the calibration switch 69, this being available at the cabinet 10. Alternatively, if external energization is desired, one of the relays 64, 65 is energized by closure of one of the terminals 70 to ground connection, most conveniently by an external switch. The diodes 71 act as EMF suppressors for the relay coils.

The first differential amplifier 33 is an integrated circuit operational amplifier having the usual inverting 74 and non-inverting 75 inputs to which the remaining terminals of the bridge 60 are connected. The resistor 76 and potentiometer 78 are used to adjust the input offset voltage of the amplifier 33 while the resistor and potentiometers 79 are employed for gain adjustment. Capacitors 80 are high frequency bypasses while the capacitor 81 and the resistor 82 provide frequency roll off for the amplifier 33 limiting its pass band to approximately 0–5000 Hz, being connected between the output 84 of the amplifier 33 and the inverting input 74.

Temperature compensation is effected in the circuit 35 including amplifier 85, again being an IC amplifier having output 86 connected by way of a potentiometer 87 to the output offset control terminal for the differential amplifier 33. Amplifier 85 is a summing amplifier having one input 89 connected to the resistor and potentiometer network 90 bridging the positive and negative terminals 91, 68 providing a means for controlling the output offset adjustment of amplifier 33 through variations in the output level of amplifier 85.

A resistor 92 is connected between the output 86 of amplifier 85 and input 89 with temperature compensation being provided at input 89 via resistors 93–95 and potentiometer 98, including the series connection of a silicon diode 98. The diode 98 provides a PN junction in which known temperature effects occur and from which temperature compensation can be derived, the characteristic of the silicon diode 98 being that if ambient temperature increases the voltage drop across the diode decreases at approximately 1.7 millivolts per degree centigrade temperature rise. Other types of semiconductor devices could be applied as well with suitable accommodation being made for the different temperature characteristics of same.

Thus for example, if the output of the differential amplifier 33 is drifting positive as a result of increase in temperatures, a similar temperature would affect the diode 98 causing a smaller voltage drop across the PN junction or an increase in the potential between the resistors 94, 95. This increase is amplified in amplifier 85 at a predetermined gain level and being applied to the inverting input 89 would cause a decrease in the voltage level at the ouput 86. The decreasing voltage would then directly subtract from the increasing voltage of the differential amplifier 33 by virtue of the connection through potentiometer 87, and if the gain of the amplifier 85 is properly adjusted will result in a net zero change of the output level of the differential amplifier 33 for temperature variations. While diode 98 provides compensation for positive voltage variations of the differential amplifier 33, a diode 99 placed as indicated in dashed lines in FIG. 4, instead of diode 98, would provide similar compensation for negative variations of the differential amplifier 33 output.

The unity gain amplifier is indicated generally at 36 comprising a second differential amplifier 38 of the integrated circuit variety and a power amplifier stage 42 consisting of transistors 100–102. The signal from the first differential amplifier 33 is applied by way of a resistor 104 and potentiometer 105 to the inverting input 106 of the second differential amplifier 38, the amplified signal being applied to the base of transistor 100 connected as an emitter follower and by way of the series diode 108 to the bases of the complementary power transistors 101, 102 providing an output signal at terminal 44. In the unity amplifier 36 gain is adjusted so that a signal corresponding to the input signal appears at the output terminal 44 suitable for external drive purposes and the like, the stage gain primarily being provided by adjustment of the potentiometer 105. The capacitors 109 are provided as high frequency bypasses and the potentiometer 110 is employed as a means for adjusting the input offset bias voltage of the differential amplifier 38.

The unity gain amplifier 36, the multiplier amplifier 51, A/D converter 52, D/A converter 54 and their associated circuitries form a closed loop feedback control system which is the automatic balance feature for this amplifier. The multiplier amplifier 51 is a single ended inverting amplifier of the IC variety having gain adjusted by the resistors 111 and potentiometer 112, offset adjustment provided by the potentiometer 114, the capacitor 115 used as high frequency bypass and capacitor 116 employed in feedback for rolling off the high frequency characteristics of the amplifier 51. An output is provided at terminal 118, this being common to the input terminal 118 of the A/D converter 52 and providing an analog signal which is a predetermined multiple of the input signal applied to the multiplier amplifier 51.

The digital converters 52, 54 are indicated only in block diagram form, these being conventional units which are available from a wide variety of manufacturers, selected to provide sufficient definition for the signals retained, i.e., by the number of stages therein, and satisfactory stability characteristics. A suitable component for application within the teachings of this invention is the A/D Converter Model A811 manufactured by the Digital Equipment Corporation having a capacity of 10 bits which may be used in conjunction with a compatible D/A converter.

Typically the A/D converter 52 is an integrated circuit component comprising a binary register of flip flop stages, indicated by the output lines 120, adapted to count to the digital equivalent of an analog signal applied at the input terminal 118 when a clock signal is received on line 121 and to retain such setting until a further clock signal is received. The D/A converter 54 typically is a resistance ladder network weighted to convert the binary signals received on lines 120 into an analog voltage on the output line 122. Zero adjustment for the A/D converter 52 is provided by the potentiometer 124 with gain adjustment provided by the potentiometer 125, similar zero and gain adjustments being provided for the D/A converter 54 by potentiometers 126, 128 respectively.

Automatic balance is selected at the option of the operator by momentary closure of push button switch 49 or alternatively by an external grounding of terminal 130 causing energization of relays 131, 132. In the de-energized condition of the relays 131, 132 as shown in FIG. 4, the output of the D/A converter 54 is applied by way of the normally closed contact 131–1 and the divider network 55 consisting of series resistors 134, 135 and the potentiometer 136 to the non-inverting input 138 of the second differential amplifier 38. The divider network 55 is set by adjustment of the potentiometer 136 to provide a signal at the input 138 of the amplifier 38 which is a fraction of the signal from the D/A converter 54 equal to the reciprocal of the gain of the multiplier amplifier 51, thereby nullifying the action of the latter.

Upon energization of the relays 131, 132 in common, contact 131–2 will become closed to connect line 140 to ground potential or any other suitable reference thereby eliminating any signal to the non-inverting input 138 of the differential amplifier 38 leaving only the unbalance signal or the signal desired to be zeroed at the inverting input 106 of amplifier 38. Simultaneous closure of the contact 132–2 also activates a bistable circuit 142 energizing delay units 144 which may be conventional monostables to provide a clock pulse on line 121 for application to the A/D converter 52, which pulse is delayed approximately 50 milliseconds from closure of the relay contact 132–2. Upon receipt of the clock pulse the A/D converter 52 is immediately pulsed to store the digital equivalent of the signal appearing at terminal 118. Upon release of the automatic balance switch 49 and reversion of the relay contacts 131–1 and 132–1 to the closed state, such signal in analog form will be continuously applied by way of line 140 to the divider network 55 and thus to the non-inverting input 138 of the differential amplifier 38.

Such balancing may be repeated as often as desired in order to attain a null condition and inasmuch as the amplifier automatically accommodates a plus or minus 12 ½ percent bridge unbalance at the gain figure of eight described, a wide range of balance operations can be obtained. If necessary, however, coarse balance potentiometer 90 associated with the bridge 60 may be adjusted to bring the level of unbalance into this range although this situation is not usually encountered. The extremely high gain available with the apparatus of this invention in the first differential amplifier stage 33 necessitates a repeated checking of the zero condition especially while gain adjustments are being made and the ready availability of this adjustment is seen to facilitate this mode of operation. The compensation provided by the temperature compensation circuit 35 alleviates, to a great extent, much of the adjustment required to accommodate temperature variations.

The embodiments of the invention in which an exclusive property or privilege is claimed are defined as follows:

1. A transducer amplifier having automatic self correction relative to a selected input signal from the transducer, comprising:

a. an amplifier stage, said amplifier stage having a first input adapted for receipt of a signal from the transducer, said amplifier stage having a second input adapted for receipt of a correction signal, and said amplifier stage providing an output signal proportional to the difference between such input signals, b. switching means for permitting input of said correction signal to said second input of said amplifier stage and for temporarily eliminating input of said correction signal to said second input of said amplifier stage, whereby when said correction signal is temporarily eliminated from said amplifier stage, a conditional output signal proportionally representative to said signal from said transducer is provided from said amplifier stage, c. means for retaining a signal proportionally representative to said conditional output signal and for continuously applying same as said correction signal to said switching means for selective application to second input of said amplifier stage, d. whereby said output signal from said amplifier stage is referenced to a selected input signal from the transducer.

2. A transducer amplifier having automatic self correction relative to a selected input signal from the transducer as set forth in claim 1, wherein said switching means comprises:

means for actuating said retaining means in correspondence with the elimination of said correction signal.

3. A transducer amplifier having automatic self correction relative to a selected input signal from the transducer as set forth in claim 2, wherein said retaining means comprises:

digital memory means having capability for accurately maintaining said signal proportionally representative to said conditional output signal over long intervals of time.

4. A transducer amplifier having automatic self correction relative to a selected input signal from the transducer as set forth in claim 3, wherein said retaining means further includes:

a multiplier stage for boosting said conditional output signal level, an analog to digital converter for applying such boosted conditional output signal to said digital memory, and a divider interconnected between said digital memory and said second input of said amplifier stage for dividing the output signal from the former before application to the latter.

5. A transducer amplifier having automatic self correction relative to a selected input signal from the transducer as set forth in claim 4, wherein said switching means comprises:

a delayed pulse generator operative to actuate said digital memory a predetermined interval after eliminating said correction signal from application to said amplifier stage.

6. A transducer amplifier having automatic self correction relative to a selected input signal from the transducer as set forth in claim 4, wherein said amplifier stage comprises a unity gain differential input amplifier, and said divider comprises an adjustable divider circuit to provide the reciprocal of the gain of said multiplier stage.

7. Apparatus for amplifying the variations of an analog input signal from a balance level, comprising:

a. an amplifier, b. said amplifier having a first input for receipt of said analog input signal, c. said amplifier having a second input, d. means for connecting said second input of said amplifier for selective receipt of a reference signal and a balance signal, e. means for supplying said balance signal derived from said analog input signal by said amplifier to said connecting means, f. said supplying means comprising means for retaining a signal proportionally representative to said balance signal in digital format, g. said connecting means comprising means for selectively switching said second input of said amplifier between a reference connection for development of said balance signal and a connection to said supplying means, h. said retaining means being responsive to said switching means for storing a new signal proportionally representative to said balance signal when said second input of said amplifier is connected to said reference connection.

8. Apparatus for amplifying the variations of an analog input signal from a balance level as set forth in claim 7, wherein said reference connection comprises:

a grounded reference connection.

9. Apparatus for amplifying the variations of an analog input signal from a balance level as set forth in claim 7, wherein said retaining means comprises an analog to digital converter, said supplying means further comprises a multiplier for modifying the output of said amplifier, means for converting the signal stored in said retaining means to analog format, and a divider for reducing such analog format signal for application to said second input of said amplifier.

10. Apparatus for amplifying the variations of an analog input signal from a balance level as set forth in claim 9, wherein said multiplier comprises a further amplifier and said divider comprises an impedance network for reducing the signal from said converting means by a factor substantially equal to the reciprocal of the gain of said further amplifier.

11. Apparatus for amplifying the variations of an analog input signal from a balance level as set forth in claim 10, wherein said converting means comprises:

a digital to analog converter compatible with said analog to digital converter.

12. Apparatus for amplifying the variations of an analog input signal from a balance level as set forth in claim 11, wherein said amplifier comprises:

a unity gain amplifier and a power amplifier for supplying a signal to said further amplifier of said multiplier.

13. Apparatus for amplifying the variations of an analog input signal from a balance level as set forth in claim 7, further including:

a second amplifier for said input signal, said second amplifier having an output connected to the first input of said first mentioned amplifier, a silicon diode, and means for monitoring the voltage change in said silicon diode as a function of temperature and for generating a compensation signal for application to said second amplifier to compensate for temperature variations of the latter.

14. Apparatus for amplifying the variations of an analog input signal from a balance level as set forth in claim 13, wherein said second amplifier comprises:

an integrated circuit amplifier, said compensation signal being applied to modify the offset of same.

15. Apparatus for amplifying the variations of an analog input signal from a balance level as set forth in claim 14, wherein said second amplifier includes:

first and second inputs adapted for receipt of a signal from a bridge network.

16. Apparatus for stabilizing an amplifier subject to drift due to temperature variations, comprising:

a. an integrated circuit amplifier, said integrated circuit amplifier having an offset circuit, b. means forming a PN junction, said PN junction having a temperature characteristic whereby the voltage drop across said PN junction varies with the temperature thereof, c. means for developing a voltage across said PN junction, said voltage being dependent upon the temperature characteristic of said PN junction, d. means for converting said voltage to a compensation signal, e. means for applying said compensation signal to said integrated circuit and amplifier in a manner to stabilize said amplifier drift, and, f. said means for applying comprising means for applying said compensation signal to modify the offset of said integrated circuit amplifier.

17. Apparatus for stabilizing an amplifier subject to drift due to temperature variations, comprising:

a. means forming a PN junction, said PN junction having a temperature characteristic whereby the voltage drop across such PN junction varies with the temperature thereof, b. means for developing a voltage across said PN junction, said voltage being dependent upon the temperature characteristic of said PN junction, c. means for converting said voltage to a compensation signal, d. means for applying said compensation signal to said amplifier in a manner to stabilize said amplifier drift, and, e. said converting means comprising an integrated circuit amplifier having adjustable gain for modifying the amplitude of said compensation signal.

* * * * *